(12) United States Patent
Fang et al.

(10) Patent No.: US 7,726,544 B2
(45) Date of Patent: Jun. 1, 2010

(54) METHOD OF PACKAGING FLIP CHIP AND METHOD OF FORMING PRE-SOLDERS ON SUBSTRATE THEREOF

(75) Inventors: Jen-Kuang Fang, Pingtung County (TW); Chung-Hwa Feng, Taoyuan (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 805 days.

(21) Appl. No.: 11/293,093

(22) Filed: Dec. 5, 2005

(65) Prior Publication Data

US 2006/0124703 A1   Jun. 15, 2006

(30) Foreign Application Priority Data

Dec. 9, 2004   (TW) ................ 93138181 A

(51) Int. Cl.
*B23K 31/02* (2006.01)
*H01L 23/48* (2006.01)
(52) U.S. Cl. ............ 228/180.22; 438/613; 438/614
(58) Field of Classification Search ......... 438/613–614; 228/180.22; 257/737–738, 777
See application file for complete search history.

(56) References Cited

U.S. PATENT DOCUMENTS

| | | | |
|---|---|---|---|
| 5,785,875 A * | 7/1998 | Hawthorne et al. ......... 216/41 |
| 6,297,140 B1 | 10/2001 | Uzoh et al. | |
| 6,368,421 B1 * | 4/2002 | Oberlander et al. ......... 134/40 |
| 6,423,625 B1 | 7/2002 | Jang et al. | |
| 6,461,953 B1 | 10/2002 | Sakuyama et al. | |
| 6,576,541 B2 * | 6/2003 | Hu ......................... 438/614 |
| 6,787,923 B2 * | 9/2004 | Tan et al. .................. 257/779 |
| 6,861,346 B2 * | 3/2005 | Tong et al. ................ 438/613 |
| 2001/0040290 A1 * | 11/2001 | Sakurai et al. ............. 257/737 |
| 2002/0179966 A1 * | 12/2002 | Yang et al. ................ 257/326 |

FOREIGN PATENT DOCUMENTS

CN   1128486   8/1996

* cited by examiner

*Primary Examiner*—Kiley Stoner
*Assistant Examiner*—Erin B Saad
(74) *Attorney, Agent, or Firm*—Bacon & Thomas, PLLC

(57) ABSTRACT

A method of forming pre-solders on a substrate is provided. Firstly, a substrate is provided. The substrate includes an upper surface and a lower surface. There are several metal circuits and a solder mask both on the upper and the lower surfaces. Each solder mask covers parts of the corresponding metal circuits and parts of the corresponding surface for exposing parts of several pads of the corresponding metal circuits. Then, a patterned photo-resist film is formed on the upper surface. The patterned photo-resist film has several openings for exposing the upper-surface pads. Afterwards, several metal materials are formed in the opening by printing. Thereon, the metal materials are reflown to form several pre-solders on the upper-surface pads. Finally, the patterned photo-resist film is removed.

20 Claims, 6 Drawing Sheets

METHOD OF PACKAGING FLIP CHIP AND METHOD OF FORMING PRE-SOLDERS ON SUBSTRATE THEREOF

This application claims the benefit of Taiwan application Serial No.93138181, filed Dec. 9, 2004, the subject matter of which is incorporated herein by reference.

BACKGROUND OF THE INVENTION

1. Field of the Invention

The invention relates in general to a method of packaging flip chip and method of forming pre-solders on substrate thereof, and more particularly to a method of packaging flip chip and a method of forming pre-solders on substrate thereof use a patterned photo-resist film in printing a metal material.

2. Description of the Related Art

The conventional method of forming pre-solders on a substrate includes the following steps. The upper-surface solder mask of the substrate covers parts of the upper-surface metal circuits and parts of the upper surface for exposing several upper-surface pads.

Firstly, a stencil such as a screen or a steel plate covers the upper-surface solder mask. Several openings on the stencil correspond to the upper-surface pads. Then, several metal materials are printed in the openings. Afterwards, a force is applied to separate the stencil from the substrate. After the stencil is removed, the metal materials are left on the upper-surface pads. Finally, the metal materials are reflown to form several pre-solders.

However, in the step of separating the stencil from the substrate, the metal materials are easily carried away by the openings of the stencil. FIG. 1 is a diagram showing the removal of a stencil when the pre-solders of a conventional substrate are formed. When the stencil 132 is separated from the substrate 100, due to the external force, the openings 134 of the stencil 132 are easy to be stained by parts of the metal material 136a or carry the metal material 136b away, resulting in the shortage of solders and affecting the subsequent process. Particularly, the scale of the substrate is designed to be smaller and smaller, thereby having fewer amount of solder on each pad. That the stencil carries parts of the metal material away severely affects the amount of solder. Besides, the scale of the substrate is designed to be smaller and smaller, and the pitches of the substrate are designed to be narrower accordingly, so the substrate requires a higher standard of precision. Therefore, the conventional method of using a screen or a steel plate as the stencil in the method of forming pre-solders on substrate can not meet the precision requirement of the substrate.

SUMMARY OF THE INVENTION

It is therefore an object of the invention to provide a method of packaging flip chip and method of forming pre-solders on substrate thereof. A patterned photo-resist film is used to replace a conventional screen or steel plate in printing a metal material, and the photo-resist film is not removed by an external force, avoiding the pre-solders being peeled off by the external force.

The invention achieves the above-identified object by providing a method of forming pre-solders on a substrate. Firstly, a substrate is provided. The substrate includes an upper surface and a lower surface. Several upper-surface metal circuits are formed on the upper surface. An upper-surface solder mask covers parts of the upper-surface metal circuits and parts of the upper surface for exposing parts of several upper-surface pads of the upper-surface metal circuits. Several lower-surface metal circuits are formed on the lower surface. A lower-surface solder mask covers parts of the lower surface metal circuits and parts of the lower surface for exposing parts of several lower-surface pads of the lower surface metal circuits. Then, a patterned photo-resist film is formed on the upper surface. The patterned photo-resist film has several openings for exposing the upper-surface pads. Afterwards, several metal materials are formed in the openings by printing. Next, the metal materials are reflown to form several pre-solders on the upper-surface pads. Finally, the patterned photo-resist film is removed.

The invention achieves the above-identified object by providing another method of packaging flip chip. Firstly, a substrate is provided. The substrate includes an upper surface and a lower surface. Several upper-surface metal circuits are formed on the upper surface. An upper-surface solder mask covers parts of the upper-surface metal circuits and parts of the upper surface for exposing parts of several upper-surface pads of the upper-surface metal circuits. Several lower-surface metal circuits are formed on the lower surface. A lower-surface solder mask covers parts of the lower surface metal circuits and parts of the lower surface for exposing parts of several lower-surface pads of the lower surface metal circuits. Then, a patterned photo-resist film is formed on the upper surface. The patterned photo-resist film has several openings for exposing the upper-surface pads. Afterwards, several metal materials are formed in the openings by printing. Next, the metal materials are reflown to form several pre-solders on the upper-surface pads. Thereon, the patterned photo-resist film is removed. Then, several metal bumps of a chip are aligned with the pre-solders of the substrate. Finally, the substrate and the chip are soldered to connect together.

Other objects, features, and advantages of the invention will become apparent from the following detailed description of the preferred but non-limiting embodiments. The following description is made with reference to the accompanying drawings.

DETAILED DESCRIPTION OF THE INVENTION

The invention discloses a method of packaging flip chip including the steps as followings: a substrate is provided; a patterned photo-resist film is formed on the upper surface, the patterned photo-resist film has several openings for exposing the upper-surface pads of the substrate; several metal materials are formed in the openings by printing; the metal materials are reflown to form several pre-solders on the upper-surface pads of the substrate; the patterned photo-resist film is removed; several metal bumps of a chip are aligned with the pre-solders of the substrate; the substrate and the chip are soldered to connect together. It is noted that an embodiment is disclosed below for illustrating the present invention, but not for limiting the scope of the present invention.

Figure 1:
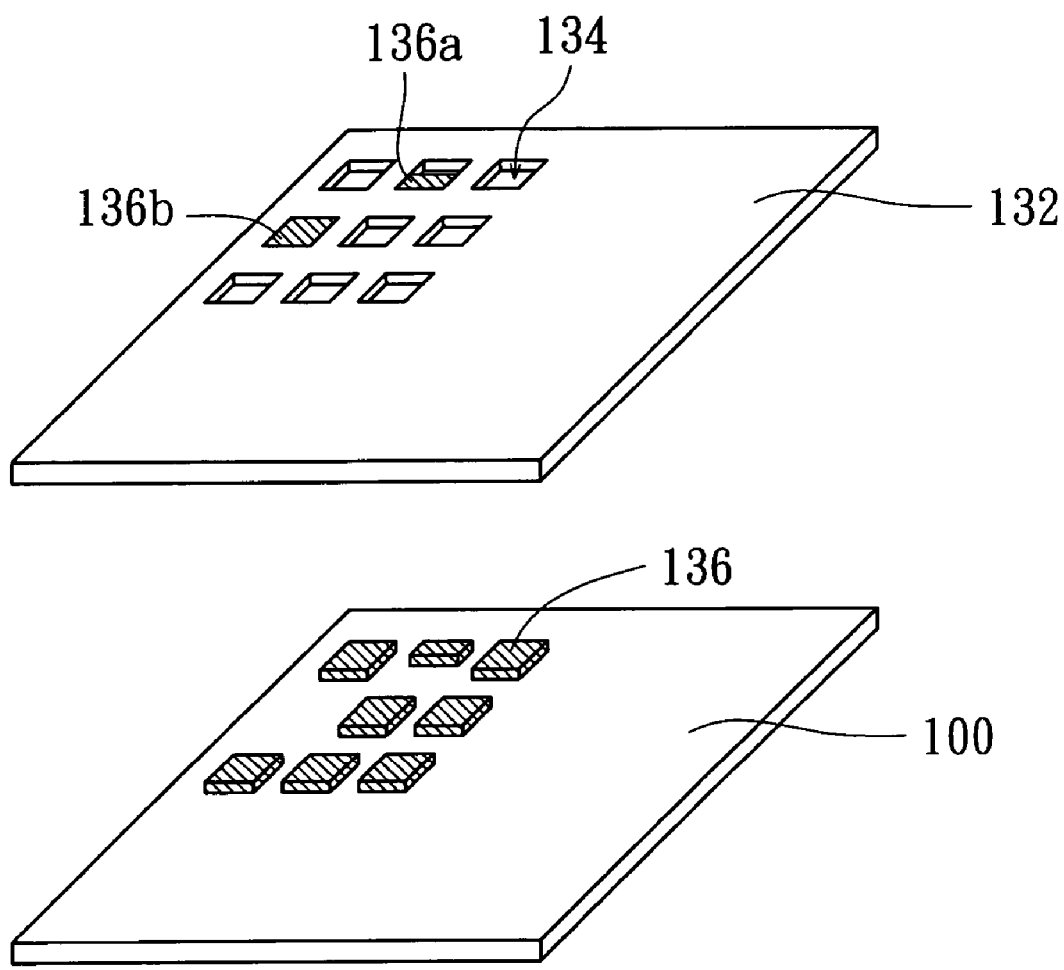
FIG. 1 (Prior Art) is a diagram showing the removal of a stencil when the pre-solders of a conventional substrate are formed.
Figure 2:
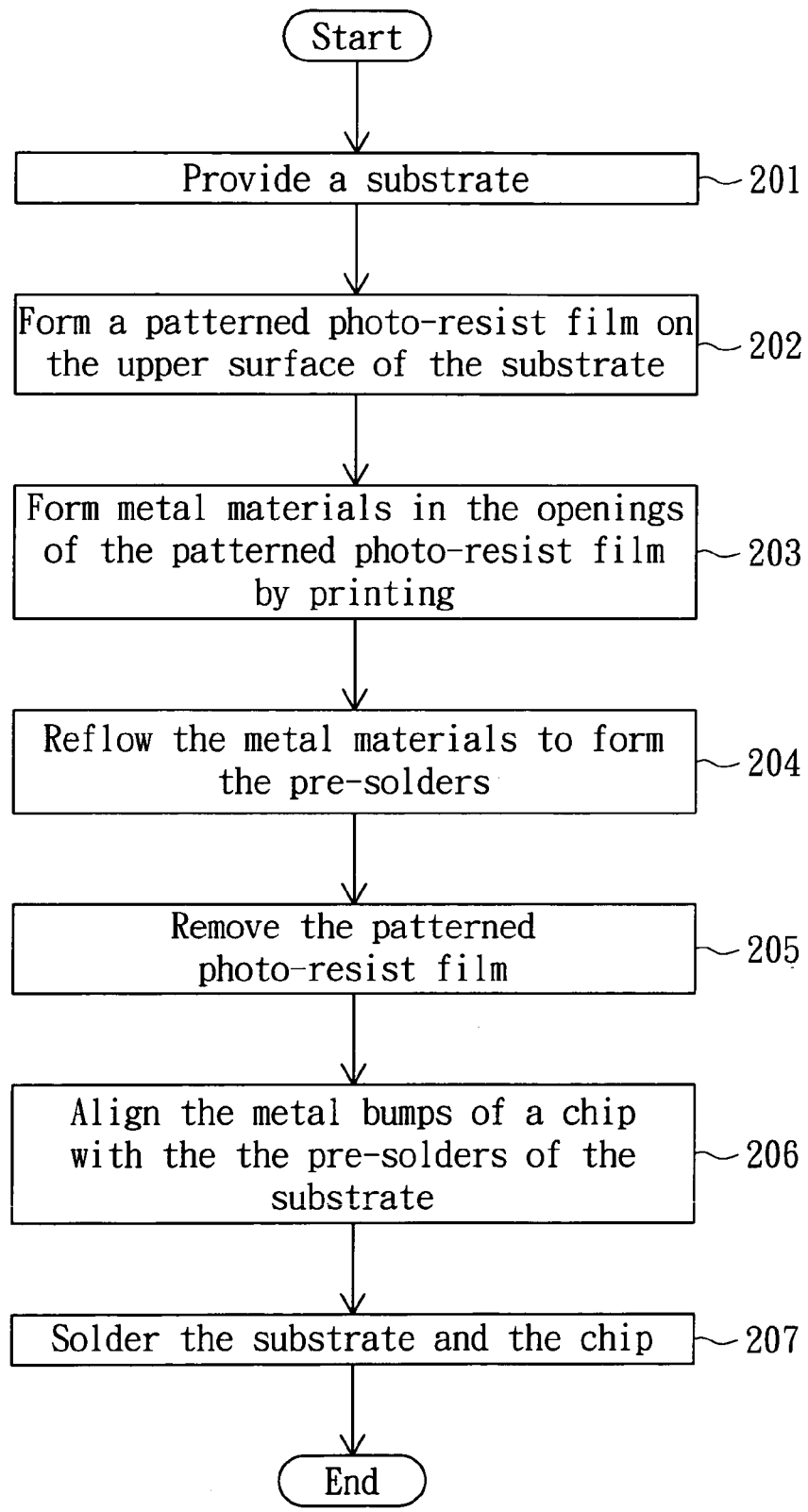
FIG. 2 is a flowchart showing a method of packaging flip chip according to a preferred embodiment of the invention.
Figure 3A:
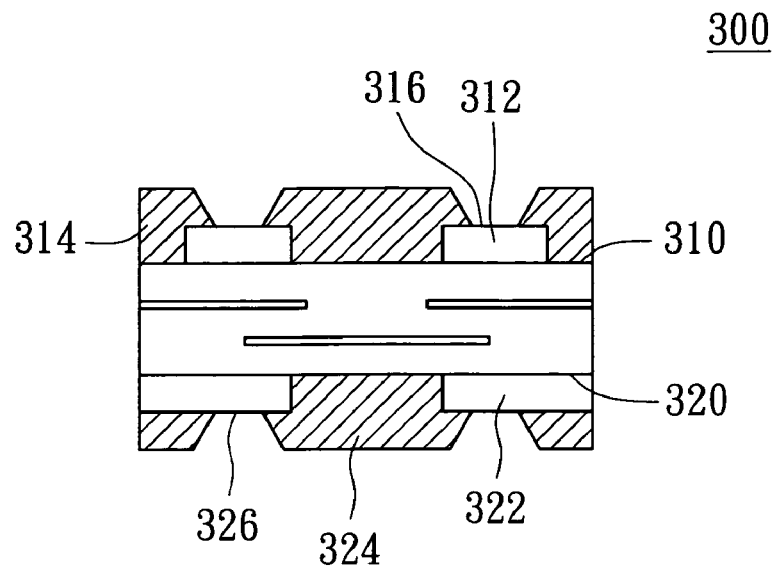
FIGS. 3A~3G are diagrams showing the method of packaging flip chip of FIG. 2.

Referring to both FIG. 2 and FIGS. 3A~3G. FIG. 2 is a flowchart showing a method of packaging flip chip according to a preferred embodiment of the invention. FIGS. 3A~3G are diagrams showing the method of packaging flip chip of FIG. 2. Firstly, the method begins at step 201: a substrate 300 is provided. As shown in FIG. 3A, the substrate 300 includes an upper surface 310 and a lower surface 320. Several upper surface metal circuits 312 are formed on the upper surface 310. The upper-surface solder mask 314 covers parts of the upper-surface metal circuits 312 and parts of the upper surface 310 for exposing parts of several upper-surface pads 316 of the upper-surface metal circuits 312. Several lower surface metal circuits 322 are formed on the lower surface 320. A lower-surface solder mask 324 covers parts of the lower surface metal circuits 322 and parts of the lower surface 320 for exposing parts of several lower-surface pads 326 of the lower surface metal circuits 322.

Figure 3B:
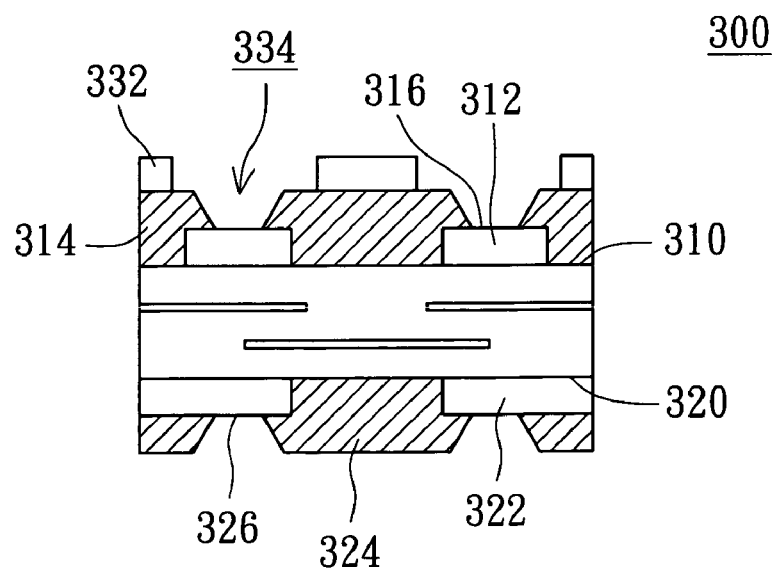

Then, proceed to step 202: a patterned photo-resist film 332 is formed on the upper surface 310 of the substrate 300 as shown in FIG. 3B. The patterned photo-resist film 332 has several openings 334. The openings 334 correspondingly expose the upper-surface pads 316. The patterned photo-resist film 332 includes a dry film or an organic film for instance. The step of forming the patterned photo-resist film 332 can further include the steps as followings: forming a photo-resist film 332 on the upper surface 310, and selectively removing the patterned photo-resist film 332 to form the openings 334. The openings 334 correspond to the upper-surface pads 316 and expose the upper-surface pads 316.

Figure 3C:
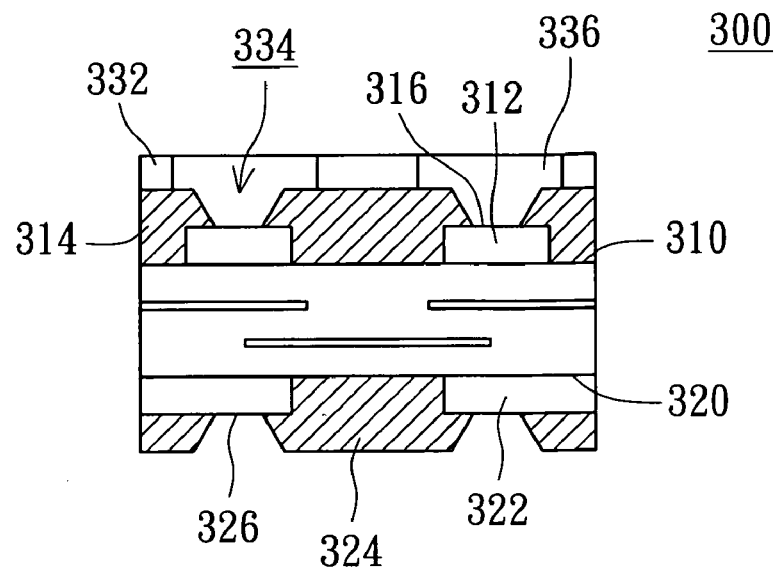

Afterwards, proceed to step 203: several metal materials 336 are formed in the opening 334 of the patterned photo-resist film 332 by printing as shown in FIG. 3C. The metal materials 336 include metal, such as tin.

Figure 3D:
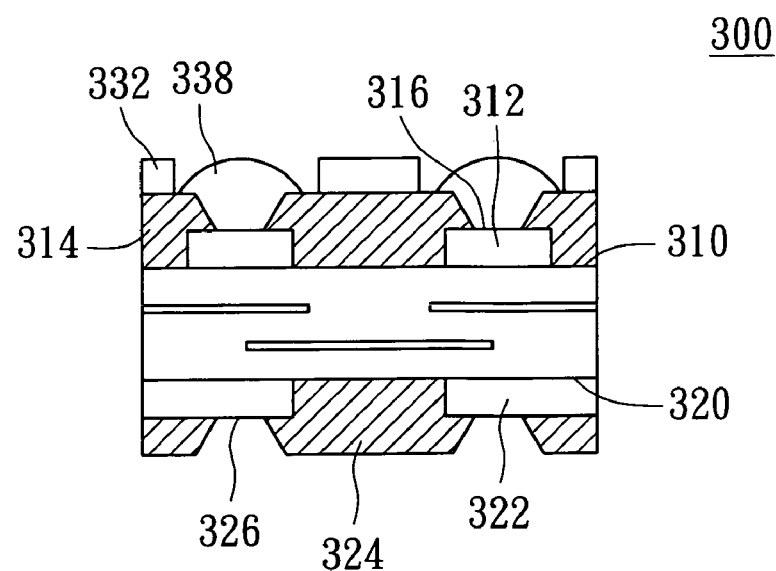

Next, proceed to step 204: the metal materials 336 are reflown to form several pre-solders 338 on the upper-surface pads 316 as shown in FIG. 3D.

Figure 3E:
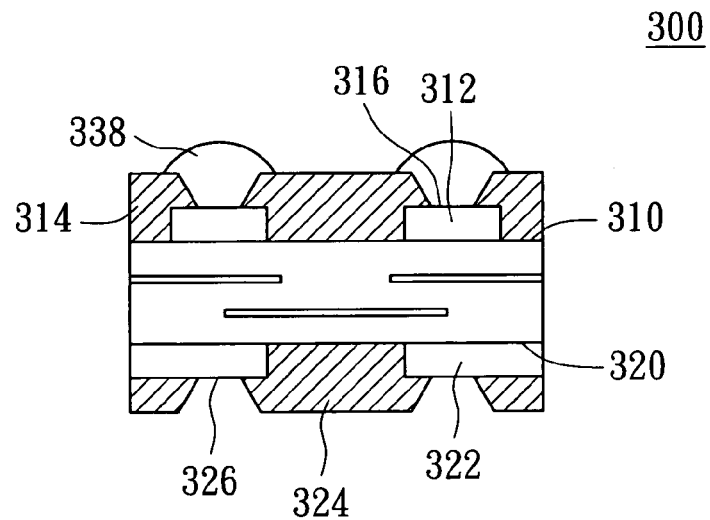

Then, proceed to step 205: the patterned photo-resist film 332 is removed 332 as shown in FIG. 3E. In the step 205, the patterned photo-resist film 332 can be removed with an organic solution. The organic solution includes acetone, N-methyl-pyrolidinone (NMP), dimethyl sulfoxide (DMSO) or aminoethoxy ethanol for instance. In the step 205, the patterned photo-resist film 332 can be removed with an inorganic solution such as an inorganic solution including sulfuric acid and hydrogen peroxide. Besides, in the step 205 of removing the patterned photo-resist film 332, the patterned photo-resist film 332 can be removed with oxygen or plasma for instance. Overall speaking, since the patterned photo-resist film 332 is removed without using an external force, the present embodiment adopts a gentle method to remove the patterned photo-resist film, thereby avoiding the peeling of pre-solders when a steel plate or a screen is removed by an external force according to a conventional method. By doing so, the amount of pre-solders can be effectively controlled, increasing stability in subsequent manufacturing processes.

Figure 3F:
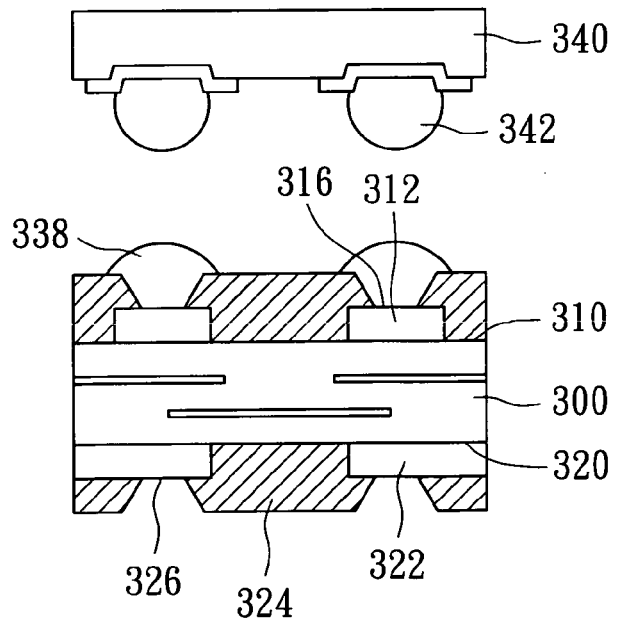

Thereon, proceed to the step 206: several metal bumps 342 of a chip 340 are aligned with the pre-solders 338 of the substrate 300 as shown in FIG. 3F.

Figure 3G:
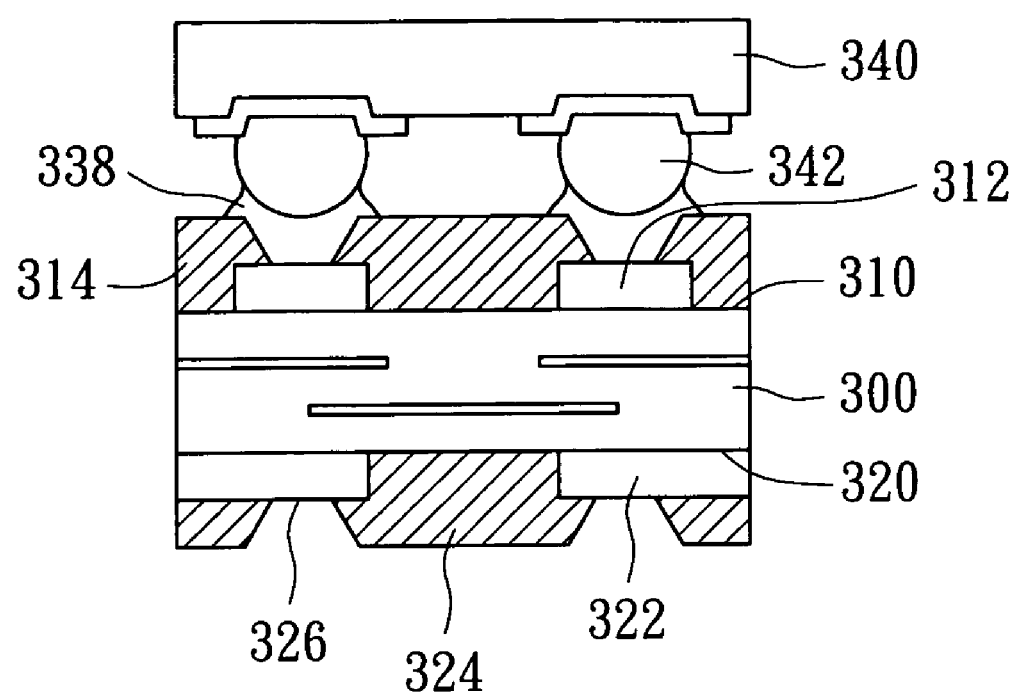

Finally, proceed to step 207: the substrate 300 and the chip 340 are soldered to connect together as shown in FIG. 3G. In the step 207, after the substrate 300 and the chip 340 are soldered, the method of packaging flip chip of the present embodiment can further include the step of forming an underfill between the chip 340 and substrate 300. By doing so, the method of packaging flip chip according to the preferred embodiment of the invention is completed.

The method of packaging flip chip and method of forming pre-solders on a substrate thereof disclosed in above embodiments of the invention removes the patterned photo-resist film without using an external force, thereby avoiding the peeling of pre-solders when a steel plate or a screen is removed by an external force according to a conventional method. That is, the method of forming pre-solders according to the preferred embodiment of the invention increases the precision of pre-solders. The current trend in the design of the substrate is headed towards a smaller scale. According to the preferred embodiment of the invention, the pre-solders complying with the precision requirement of the substrate can be formed the substrate having narrower pitches.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method of forming pre-solders on a substrate, comprising:
   providing a substrate, wherein the substrate comprises an upper surface and a lower surface, a plurality of upper-surface metal circuits are formed on the upper surface;
   forming an upper-surface solder mask on the substrate to cover parts of the upper-surface metal circuits and parts of the upper surface for exposing a plurality of upper-surface pads on parts of the upper-surface metal circuits;
   forming a patterned photo-resist film on the upper-surface of the mask, wherein the patterned photo-resist film has a plurality of openings for exposing the upper-surface pads;
   forming a plurality of metal materials in the openings by printing after the step of forming the patterned photo-resist film;
   reflowing the metal materials after the step of forming the metal materials in the openings, so as to form a plurality of pre-solders on the upper-surface pads, wherein the pre-solders directly contact with the upper-surface solder mask and cover parts of an upper-surface of the upper-surface solder mask, and each of the pre-solders is spaced apart from the patterned photo-resist film by an interval so as not to contact the patterned photo-resist film; and
   removing the patterned photo-resist film after the step of reflowing the metal materials while reserving the upper-surface solder mask on the substrate.

2. The method according to claim 1, wherein the step of forming the patterned photo-resist film on the upper surface comprises:
   forming a photo-resist film on the upper surface; and
   selectively removing the photo-resist film to form the openings, wherein the openings correspond to the upper-surface pads and expose the upper-surface pads.

3. The method according to claim 1, wherein the step of removing the patterned photo-resist film removes the patterned photo-resist film with an organic solution.

4. The method according to claim 3, wherein the organic solution includes acetone, N-methyl-pyrolidinone (NMP), dimethyl sulfoxide (DMSO) or aminoethoxy ethanol.

5. The method according to claim 1, wherein the step of removing the patterned photo-resist film removes the patterned photo-resist film with an inorganic solution.

6. The method according to claim 5, wherein the inorganic solution includes sulfuric acid and hydrogen peroxide.

7. The method according to claim 1, wherein the step of removing the patterned photo-resist film removes the patterned photo-resist film with oxygen or plasma.

8. The method according to claim 1, wherein the patterned photo-resist film includes a dry film.

9. The method according to claim 1, wherein the patterned photo-resist film includes an organic film.

10. The method according to claim 1, wherein the metal materials include tin.

11. A method of packaging flip chip, comprising:
 providing a substrate, wherein the substrate comprises an upper surface and a lower surface, a plurality of upper-surface metal circuits are formed on the upper surface;
 forming an upper-surface solder mask on the substrate to cover parts of the upper-surface metal circuits and parts of the upper surface for exposing a plurality of upper-surface pads on parts of the upper-surface metal circuits;
 forming a patterned photo-resist film on the upper-surface of the mask, wherein the patterned photo-resist film has a plurality of openings for exposing the upper-surface pads;
 forming a plurality of metal materials in the openings by printing after the step of forming the patterned photo-resist film;
 reflowing the metal materials after the step of forming the metal materials in the openings, so as to form a plurality of pre-solders on the upper-surface pads, wherein the pre-solders directly contact with the upper-surface solder mask and cover parts of an upper-surface of the upper-surface solder mask, and each of the pre-solders is spaced apart from the patterned photo-resist film by an interval so as not to contact the patterned photo-resist film;
 removing the patterned photo-resist film after the step of reflowing the metal materials while reserving the upper-surface solder mask on the substrate;
 aligning a plurality of metal bumps of a chip with the pre-solders of the substrate; and
 soldering the substrate and the chip.

12. The method according to claim 11, wherein the step of forming the patterned photo-resist film on the upper surface comprises:
 forming a photo-resist film on the upper surface; and
 selectively removing the photo-resist film to form the openings, wherein the openings correspond to the upper-surface pads and expose the upper-surface pads.

13. The method according to claim 11, wherein the step of removing the patterned photo-resist film removes the patterned photo-resist film with an organic solution.

14. The method according to claim 13, wherein the organic solution includes acetone, N-methyl-pyrolidinone (NMP), dimethyl sulfoxide (DMSO) or aminoethoxy ethanol.

15. The method according to claim 11, wherein the step of removing the patterned photo-resist film removes the patterned photo-resist film with an inorganic solution.

16. The method according to claim 15, wherein the inorganic solution includes sulfuric acid and hydrogen peroxide.

17. The method according to claim 11, wherein the step of removing the patterned photo-resist film removes the patterned photo-resist film with oxygen or plasma.

18. The method according to claim 11, wherein the patterned photo-resist film includes a dry film.

19. The method according to claim 11, wherein the patterned photo-resist film includes an organic film.

20. The method according to claim 11, wherein the metal materials include tin.

* * * * *